US00RE45154E

(19) United States
(12) Reissued Patent
Wallgram et al.

(10) Patent Number: US RE45,154 E
(45) Date of Reissued Patent: Sep. 23, 2014

(54) TOOL FOR MACHINING

(75) Inventors: Wolfgang Wallgram, Breitenwang (AT); Uwe Schleinkofer, Reutte (AT); Karl Gigl, Vils (AT); Josef Thurner, Heiterwang (DE); Wilfried Schintlmeister, Reutte (AT)

(73) Assignee: Ceratizit Austria Gesellschaft mbH, Reutte (AT)

(21) Appl. No.: 13/507,301

(22) Filed: Feb. 28, 2012

Related U.S. Patent Documents

Reissue of:
(64) Patent No.: 8,021,757
Issued: Sep. 20, 2011
Appl. No.: 11/807,281
Filed: May 25, 2007

U.S. Applications:
(63) Continuation of application No. PCT/AT2005/000478, filed on Nov. 28, 2005.

(30) Foreign Application Priority Data

Dec. 2, 2004 (AT) ..... GM872/2004

(51) Int. Cl.
*B32B 9/00* (2006.01)
*C23C 30/00* (2006.01)

(52) U.S. Cl.
USPC ..... 428/472; 51/307; 51/309; 407/119; 427/348; 427/404; 427/419.1; 427/419.2; 427/419.7; 428/336; 428/697; 428/698; 428/699; 428/701; 428/702; 428/704

(58) Field of Classification Search
USPC ..... 51/307, 309; 428/336, 472, 697, 698, 428/699, 701, 702, 704; 427/348, 404, 427/419.1, 419.2, 419.7; 407/119
See application file for complete search history.

(56) References Cited

U.S. PATENT DOCUMENTS 3,945,807 A * 3/1976 Fukutome ..... 407/119
4,411,566 A * 10/1983 Lee et al. ..... 407/119

(Continued)

FOREIGN PATENT DOCUMENTS

DE 195 46 357 A1 6/1996
DE 19546357 * 6/1996

(Continued)

OTHER PUBLICATIONS

Tong et al Wear Behavior of an Al-12% Si Alloy Reinforced with a Low Volume Fraction of SiC Particles: Composites Science & Technology 57, 1998 p. 1551-1558.*

(Continued)

*Primary Examiner* — Archene Turner
(74) *Attorney, Agent, or Firm* — Laurence A. Greenberg; Werner H. Stemer; Ralph E. Locher

(57) ABSTRACT

A tool for machining is made from a hard-metal, cermet or ceramic base material and a single-layer or multi-layer hard material coating on the base material. An additional coating of one or more metals from the group of aluminum, copper, zinc, titanium, nickel, tin or base alloys of these metals is applied to the hard material coating.

15 Claims, 3 Drawing Sheets

(56) References Cited

U.S. PATENT DOCUMENTS

| | | | | | |
|---|---|---|---|---|---|
| 4,415,421 | A | * | 11/1983 | Sasanuma | 204/192.15 |
| 4,468,309 | A | * | 8/1984 | White | 427/528 |
| 4,629,661 | A | * | 12/1986 | Hillert et al. | 428/698 |
| 4,640,869 | A | * | 2/1987 | Loth | 428/699 |
| 4,707,238 | A | * | 11/1987 | Okubo | 427/528 |
| 4,973,388 | A | * | 11/1990 | Francois et al. | 205/186 |
| 5,882,778 | A | * | 3/1999 | Sugizaki et al. | 428/216 |
| 6,065,905 | A | * | 5/2000 | Kinton | 407/53 |
| 6,123,999 | A | | 9/2000 | Felix et al. | |
| 6,213,692 | B1 | | 4/2001 | Guehring et al. | |
| 6,254,984 | B1 | * | 7/2001 | Iyori | 428/698 |
| 6,284,366 | B1 | * | 9/2001 | Konig et al. | 428/336 |
| 6,450,271 | B1 | * | 9/2002 | Tibbitts et al. | 175/374 |
| 6,623,850 | B2 | * | 9/2003 | Kukino et al. | 428/336 |
| 6,713,172 | B2 | | 3/2004 | Ljungberg et al. | |
| 6,855,413 | B2 | * | 2/2005 | Ljungberg | 428/701 |
| 6,869,334 | B1 | * | 3/2005 | Leyendecker et al. | 451/38 |
| 7,153,562 | B2 | | 12/2006 | Rodmar et al. | |
| 7,470,296 | B2 | | 12/2008 | Lindholm et al. | |
| 2002/0122701 | A1 | | 9/2002 | Ljungberg et al. | |
| 2002/0136895 | A1 | * | 9/2002 | Kohara et al. | 428/457 |
| 2002/0187370 | A1 | * | 12/2002 | Yamagata et al. | 428/698 |
| 2004/0180241 | A1 | * | 9/2004 | Rodmar et al. | 428/698 |

FOREIGN PATENT DOCUMENTS

| | | | | |
|---|---|---|---|---|
| DE | 195 11 829 | A1 | | 10/1996 |
| DE | 19511829 | | * | 10/1996 |
| DE | 199 08 107 | A1 | | 8/2000 |
| DE | 19908107 | | * | 8/2000 |
| DE | 199 24 422 | A1 | | 11/2000 |
| DE | 19924422 | | * | 11/2000 |
| EP | 1455003 | A2 | | 9/2004 |
| IL | 169164 | A | | 6/2010 |
| JP | 61-064370 | A | | 4/1986 |
| JP | 62048413 | A | | 3/1987 |
| JP | 06-079542 | A | | 3/1994 |
| JP | 06-143293 | | * | 5/1994 |
| JP | 2001-517269 | A | | 10/2001 |
| JP | 2002205205 | A | | 7/2002 |
| JP | 2002-538016 | A | | 11/2002 |
| KR | 1019980703502 | A | | 11/1998 |
| WO | 95/21994 | | * | 8/1995 |
| WO | 96/30148 | | * | 10/1996 |
| WO | WO 96/30148 | | | 10/1996 |
| WO | 98/25017 | | * | 6/1998 |

OTHER PUBLICATIONS

Japanese Office action dated Jul. 12, 2011.

Tjong, et al., "Wear Behaviour of an Al-12% Si Alloy Reinforced with a Low Volume Fraction of SiC Particles", Composites Science and Technology 57, dated 1998, pp. 1551-1558.

* cited by examiner

TOOL FOR MACHINING

Matter enclosed in heavy brackets [ ] appears in the original patent but forms no part of this reissue specification; matter printed in italics indicates the additions made by reissue.

CROSS-REFERENCE TO RELATED APPLICATION

This is a continuation, under 35 U.S.C. §120, of copending international application No. PCT/AT2005/000478, filed Nov. 28, 2005, which designated the United States; this application also claims the priority, under 35 U.S.C. §119, of Austrian application No. GM 872/2004, filed Dec. 2, 2004; the prior applications are herewith incorporated by reference in their entirety.

BACKGROUND OF THE INVENTION

Field of the Invention

The invention relates to a tool for machining made from a hard-metal, cermet or ceramic base material and a single-layer or multi-layer hard material coating applied to the base material.

Tools for machining that are made from hard metal or cermet (ceramic/metal) still do not have the optimum wear resistance and edge life in many specific machining cases. They are, therefore, additionally provided with a single-layer or multi-layer hard material layer.

Examples of such hard material layers are carbidic, nitridic, carbonitridic, oxidic or boridic compounds of various metals and nonmetallic, superhard compounds.

Hard material layers that are used particularly frequently are, for example, titanium nitride, titanium carbonitride and aluminium oxide, which are used alone or in combination with one another.

To apply these hard material layers, chemical or physical vapor deposition processes, known as CVD (chemical vapor deposition) and PVD (physical vapor deposition) processes, are primarily used.

Depending on the coating processes used, production-induced surface roughnesses of the base material to be coated, the crystallinity of the hard materials and process-induced layer growth characteristics as well as impurities cause undesired microroughnesses on the free surface of the coating, which can impair the wear resistance and consequently the edge life of the tool. In order to reduce these surface roughnesses as much as possible, and thereby improve the cutting edge stability, such tools have been subjected to a subsequent smoothing treatment after the application of the hard material layer, at least on the free surfaces or cutting edges on which the removed chip runs off. A process that is used very often today for the subsequent treatment of the surface of the layer is the blasting process. In the case of this process, generally granular abrasives with grain sizes of approximately 1-2000 μm are fired in a dry form by compressed air or in a wet form as a suspension by positive pressure onto the surface and smoothing of the surface is achieved as a result. Corundum is frequently used as the abrasive.

German patent DE 199 24 422 C2 and its counterpart U.S. Pat. No. 6,869,334 B1, for example, describe such a blasting process in which $Al_2O_3$ or SiC with grain sizes of 1-100 μm are used in particular as the abrasive and, as a difference from other blasting processes, the abrasive has a sharp-edged grain shape.

A disadvantage of such blasting processes that are used is that reproduced, controlled removal of thin top layers or of parts of the hard material layers can often only be achieved with difficulty and considerable effort. In addition, in the case of the previously known blasting processes, no color-changing top layer is achieved.

Another possible way of increasing the wear resistance of cutting tools coated with hard material is to apply soft sliding layers, on which the chip running off slides away, whereby the wear of the tool face is reduced. At the same time, the friction between the flank of the tool and the workpiece is reduced, whereby the wear in the region of the tool flank is also reduced.

International PCT publication WO 96/30148 and its counterpart U.S. Pat. No. 6,213,692 B1, by way of example, describe a cutting tool with which sulphides, selenides, tellurides or mixed compounds thereof are applied as corresponding sliding layers.

The disadvantage of such layers is that they usually only have a low thermal, chemical and mechanical stability with respect to abrasion and sometimes inadequate layer adhesion under the high thermal, chemical and mechanical stresses that occur during machining. In addition, no change in the colouring, and consequently possible improvement in the detection of wear, is achieved with such layers either.

SUMMARY OF THE INVENTION

It is accordingly an object of the invention to provide a machining tool, which overcomes the above-mentioned disadvantages of the heretofore-known devices and methods of this general type and which, in comparison with the prior art-type after-treated tools, has improved wear resistance, and consequently a longer edge life, can be produced cost-effectively and inexpensively, and with which much improved detection of wear is ensured.

With the foregoing and other objects in view there is provided, in accordance with the invention, a tool for machining, comprising:

a tool body made of a base material selected from the group consisting of hard-metal, cermet, and ceramic;

a hard material coating applied to said base material; and an additional coating of one or more metals selected from the group consisting of aluminum, copper, zinc, titanium, nickel, tin, or base alloys of the metals applied to said hard material coating.

In other words, the objects are achieved, according to the invention, with an additional coating of one or more metals selected from the group including aluminum, copper, zinc, titanium, nickel, tin or base alloys of these metals being applied to the hard material coating.

Completely surprisingly, it has been found that improved chip flow is achieved by the after-treatment according to the invention, so that, in the case of dry turning in particular, there is no damage to the cutting edges, and consequently there is a significant increase in the possible operating time of the cutting tool.

Added to this as an advantageous side effect is that the colouring of the cutting tool is changed by the metallically bright character and, as a result, the detection of wear is made much easier, in particular in the case of cutting tools that are provided with a dark-grey or dark-brown or black aluminium oxide layer as the uppermost hard material layer.

The coating according to the invention can be advantageously used on all known hard material layers, such as in the case of layers of carbides, nitrides, carbonitrides or borides of the metals of the group IVa-VIa of the periodic table, such as for example Ti, Zr, Hf and combinations thereof and these together with additives of, for example, oxygen and/or boron, as well as in the case of layers of TiAlN and in the case of layers that consist entirely or partially of aluminium oxide and/or zirconium oxide.

For the application of the coating according to the invention it is possible to use, inter alia, known coating processes such as CVD or PVD processes as well as other known coating processes.

With regard to an advantageous thickness of the coating according to the invention, layer thicknesses in the range of 0.05-50 μm, preferably in the range of 0.1-10 μm, have proven to be successful.

The application of the coating according to the invention is of advantage in particular whenever the uppermost layer of the hard material coating comprises a layer containing aluminium oxide, since the detection of wear is particularly problematic due to the great light absorption of the aluminium oxide.

In the case of hard material coatings in which the uppermost layer contains titanium carbide, titanium carbonitride, titanium nitride or titanium diboride, particularly good results with regard to improvement of the wear resistance are achieved by the application of the additional coating according to the invention.

Aluminium and aluminium base alloys, in particular an aluminium base alloy with 12% by weight silicon, and bronze and bronze alloys, which on the one hand have excellent sliding or lubricating properties and on the other hand outstandingly even out the irregularities of the uppermost layer of the hard material layer, and consequently significantly improve the wear behaviour of the tool treated according to the invention, have proven to be particularly advantageous materials for the coating layers according to the invention. In addition, specific changes in the colour of the tool are obtained, making particularly clear detection of wear on the tool possible by virtue of the great light reflection.

In particular, it is expedient to perform the application of a coating according to the invention in the case of indexable inserts. In this case, it is particularly inexpensive and easy to perform the application of the coating according to the invention by a blasting treatment using an abrasive consisting of the desired coating metal.

It may also be of advantage to subject the uppermost hard material layer to a blasting treatment with a nonmetallic abrasive, such as corundum for example, before the application of the coating according to the invention. As a result, the surface is already pre-smoothed and the application of the coating according to the invention can then be performed with smaller layer thicknesses.

Apart from this special advantageous pretreatment for smoothing the uppermost hard material layer, it goes without saying that other known processes, such as for example mechanical brushing, abrasive media burnishing, etc., can also be used.

Other features which are considered as characteristic for the invention are set forth in the appended claims.

Although the invention is illustrated and described herein as embodied in tool for machining, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific examples when read in connection with the accompanying drawing figures.

DETAILED DESCRIPTION OF THE INVENTION

Example 1

Indexable inserts comprising a hard metal substrate with 5.8% Co, 1% TiC, 0.8% ZrC, 0.2% ZrN, 4.1% TaC, the remainder WC, coated with multiple layers of an 18 μm thick Ti(C,N)/Al2O3 mixed oxide/Ti(C,N,B)/TiN hard material coating, were blasted for 1 minute in a blasting installation with grit of an aluminium-silicon alloy with 12% by weight silicon and a grain size of 100-315 μm under a pressure of 2.5 bar. The indexable inserts were thereby provided with a thin, metallically bright coating.

These indexable inserts coated according to the invention with an Al—Si alloy were used in a machining test for the turning of construction steel Ck45, with a strength of 700 N/mm2, at a cutting rate of 300 m/min, with a feed rate of 0.25 mm/rev and a cutting depth of 2 mm, without coolant. For purposes of comparison, the same hard material coated indexable inserts, but without the coating according to the invention, were used for turning under the same conditions.

Figure 1:
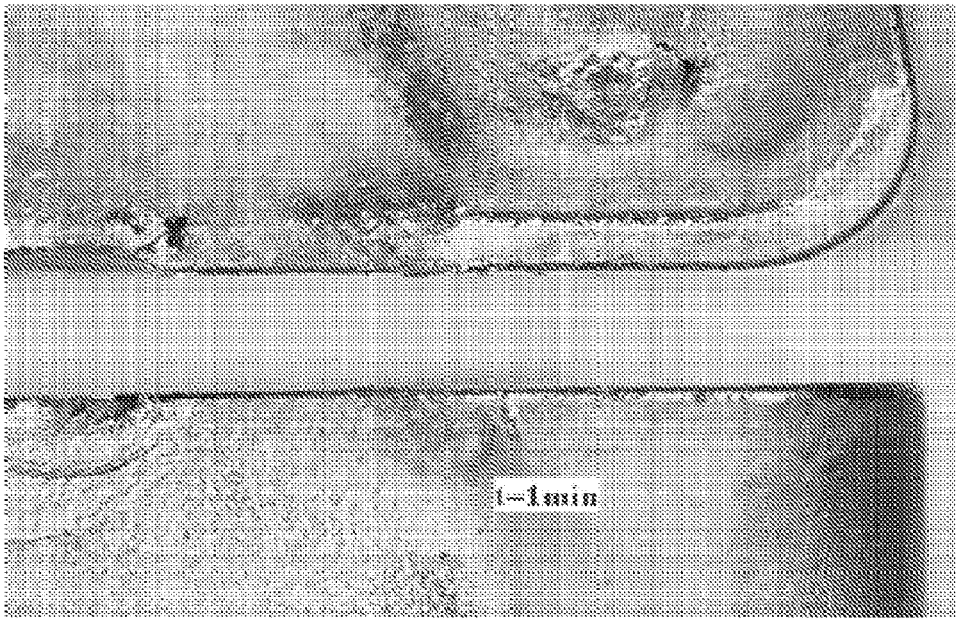
FIGS. 1-5 are magnified views of the cutting edge of indexable cutting inserts after specified periods of use in a machining operation.

It was thereby found that, with the indexable inserts not coated according to the invention, after turning for only 1 minute the cutting edges directly next to the wear marks were already damaged. These instances of damage are shown in FIG. 1 by way of example by images of the tool face and the tool flank of an indexable insert.

Figure 2:
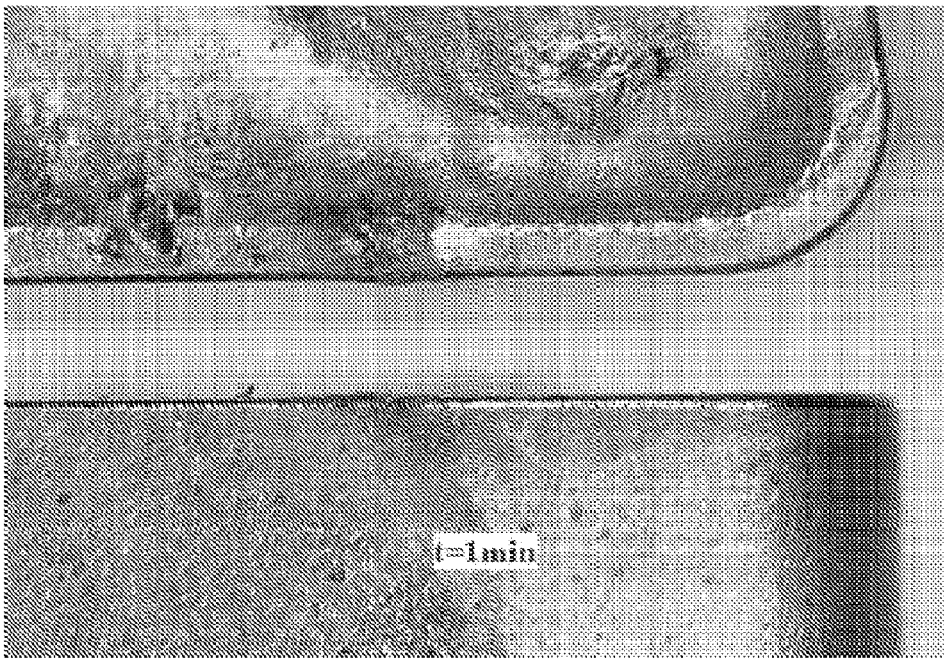

With the indexable inserts coated according to the invention, no damage could be found on the cutting edge after turning for the same time of 1 minute (t=1 min). Reference is had to the image of the indexable insert shown in FIG. 2.

It is evident from this that the edge life of the cutting edge is prolonged by the metallic coating according to the invention.

Example 2

Indexable inserts with the same hard metal substrate/hard material layer construction as in Example 1 were blasted for 1 minute in a blasting installation with brass grit having a grain size of 100-315 μm under a pressure of 2.5 bar.

These indexable inserts coated with brass according to the invention were once again subjected to the same machining test as in Example 1 together with identical indexable inserts without the brass coating according to the invention and were compared with one another.

In a way similar to that already shown in FIG. 1 by way of example on an indexable insert according to Example 1, after turning for only 1 minute (t=1 min) the indexable inserts not coated according to the invention were already damaged on the cutting edges by the running-off chip.

Figure 3:
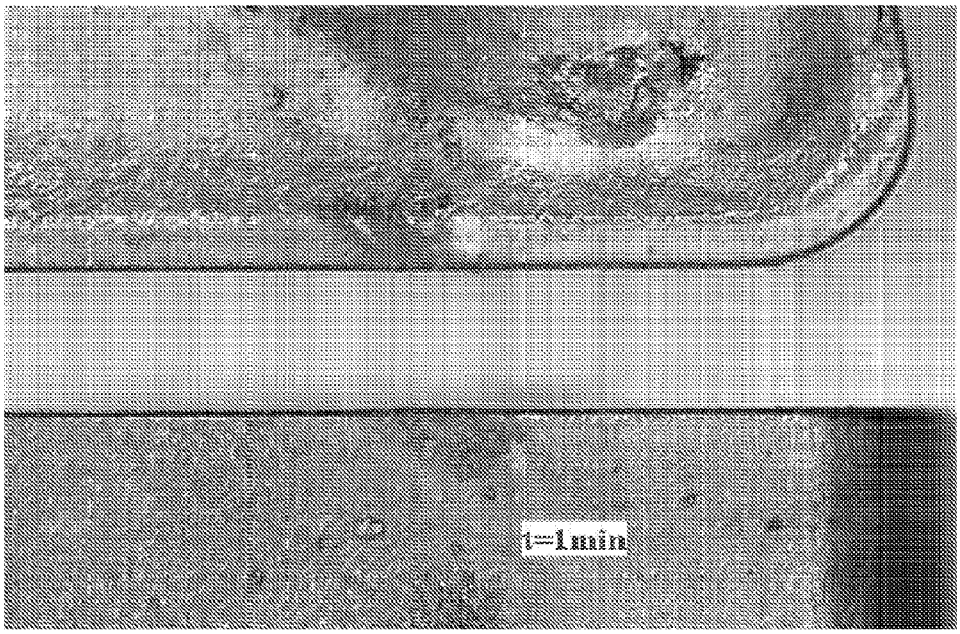

The indexable inserts coated with brass according to the invention did not exhibit any damage on the cutting edges after turning for the same time. This is shown in FIG. 3 by way of example on an indexable insert.

Example 3

The same indexable inserts as in Example 1, on the one hand coated according to the invention and on the other hand without an additional coating, were used in a second machining test for the turning of steel Ck45, with a strength of 700 N/mm2, at a cutting rate of 320 m/min and with a feed rate of 0.3 mm/rev and a cutting depth of 2 mm, using a cooling emulsion.

Figure 4:
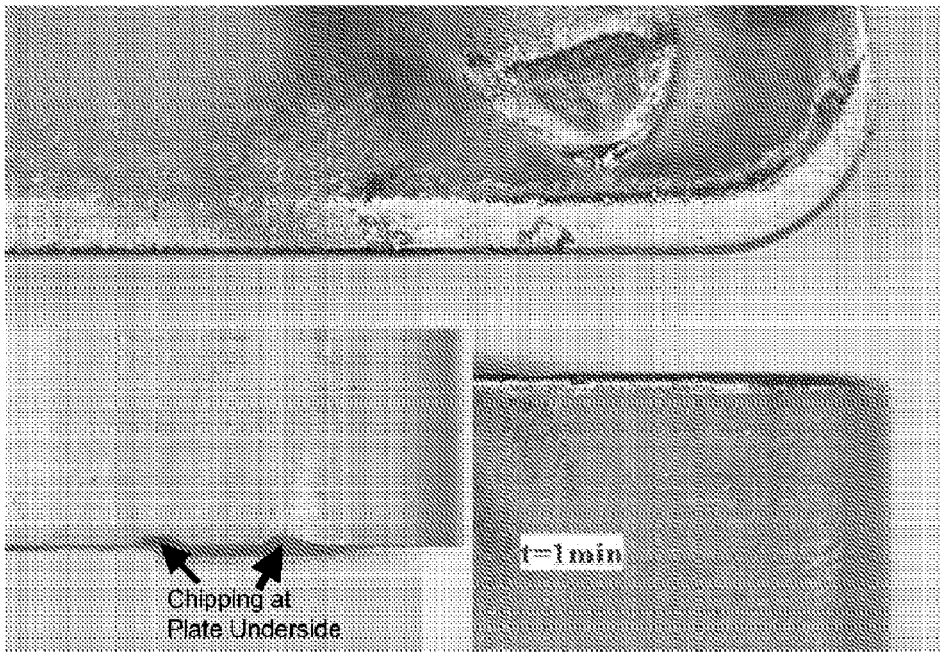
Figure 5:
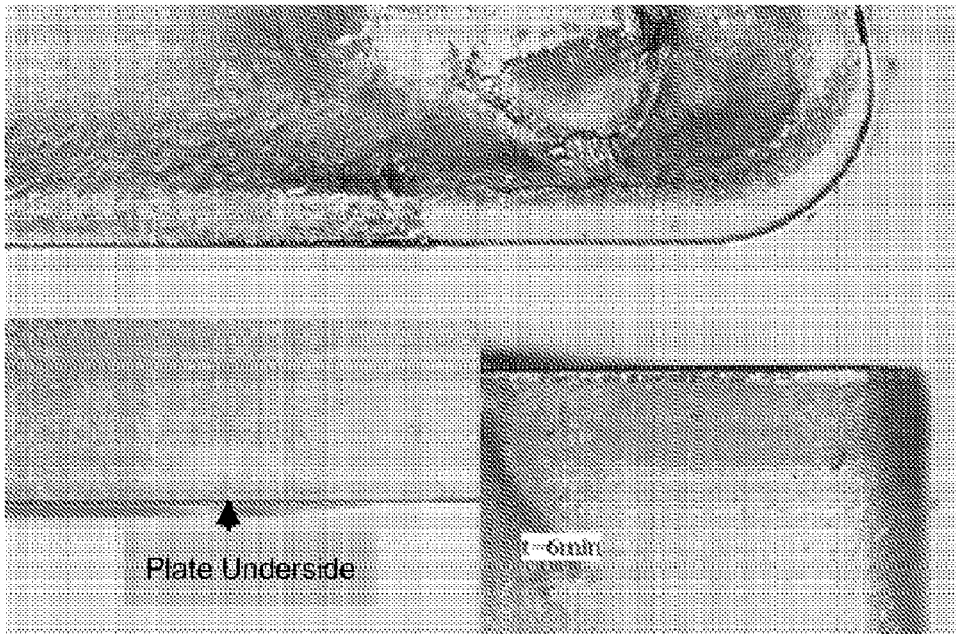

It was thereby found that, after turning for only 1 minute the indexable inserts coated according to the invention were already damaged on the underside by the running-off chip in such a way that the cutting edges at this point of the indexable insert could no longer be used for turning. These instances of damage are shown in FIG. 4 by way of example by the images of the tool face of an indexable insert. In the case of the indexable inserts coated according to the invention, even after turning for 6 minutes no damage caused by the running-off chip was evident at all on the underside, which is shown in FIG. 5 by way of example by the image of an indexable insert.

It is evident from these examples that the serviceability of hard material coated tools can be significantly increased by the treatment for them according to the invention.

Example 4

Indexable inserts comprising a hard metal substrate with 6% Co, the remainder WC, were coated with a 16 μm thick multi-layer hard material coating of Ti(C,N)/Ti(C,N,B)/$Al_2O_3$ mixed oxide. Subsequently, some of the indexable inserts were coated with a coating according to the invention of an Al—Si coating as in Example 1.

In a comparative machining test, both variants of the indexable insert were used for the turning of cast ferrous metal GG25, hardness 190 HB, at a cutting rate of 350 m/min, with a feed rate of 0.3 mm/rev and a cutting depth of 2 mm, without the use of a cooling emulsion.

The indexable inserts with the coating according to the invention of the Al—Si alloy had on average a 28% higher edge life until the maximum permissible wear mark width of 0.3 mm was reached.

Example 5

Indexable inserts comprising a hard metal substrate with 6% Co, 2% TaC, the remainder WC, were coated as in Example 4 and some of the inserts were coated with a coating according to the invention of an Al—Si alloy as in Example 1. Both variants of the indexable insert were subjected to the same comparative machining test as in Example 4.

Indexable inserts with the Al—Si coating according to the invention had on average a 21% higher edge life until the maximum permissible wear mark width 0.3 mm was reached.

The invention claimed is:

1. A tool for machining, comprising:

a tool body made of a base material selected from the group consisting of hard-metal, cermet, and ceramic;

a hard material coating applied to said base material; and an additional metallic coating of one or more metals selected from the group consisting of aluminum, copper, zinc, [titanium, nickel,] tin, or base alloys of the metals applied directly on said hard material coating.

2. The tool according to claim 1, wherein said hard material coating is a single-layer or a multi-layer hard material coating.

3. The tool according to claim 1, wherein said additional coating has a layer thickness in a range from 0.05 to 50 μm.

4. The tool according to claim 3, wherein the layer thickness of said additional layer is between 0.1 and 10 μm.

5. The tool according to claim 1, wherein said hard material coating has an uppermost layer containing aluminum oxide.

6. The tool according to claim 1, wherein said hard material coating has an uppermost layer containing titanium carbide, titanium carbonitride, titanium nitride, or titanium boride.

7. The tool according to claim 1, wherein said additional coating consists of aluminum or a base alloy of aluminum.

8. The tool according to claim 1, wherein said additional coating consists of an aluminum base alloy with 12% by weight silicon.

9. The tool according to claim 1, wherein said additional coating consists of a brass or bronze alloy.

10. The tool according to claim 1, wherein said tool body is configured to form an indexable insert.

11. The tool according to claim 1, wherein said additional coating is a substantially pure metallic coating.

12. A tool for machining, comprising:

a tool body made of a base material selected from the group consisting of hard-metal, cermet, and ceramic, and having at least one machining tool cutting edge;

a hard material coating applied to said base material; and an additional metallic coating of one or more metals selected from the group consisting of aluminum, copper, zinc, [titanium, nickel,] tin, or base alloys of the metals applied directly on said hard material coating; and wherein said tool body, said hard material coating, and said additional metallic coating together form a machining tool with a surface that is resistant to thermal, chemical, and mechanical stresses that occur during machining.

13. A method for producing a machining tool according to claim 1, which comprises providing a tool body coated with a hard material layer, and applying an additional coating by performing a blasting treatment of an uppermost layer of the hard material layer, and using granular abrasives with a desired composition of the additional coating in the blasting treatment.

14. A method for producing a machining tool according to claim 1, which comprises providing a tool body coated with a hard material, subjecting an uppermost hard material layer to a blasting treatment with a nonmetallic abrasive, and subsequently applying an additional coating.

15. The method according to claim 14, which [comprising] *comprises* blasting the hard material with corundum.

* * * * *